United States Patent
Park et al.

(10) Patent No.: US 10,484,642 B2
(45) Date of Patent: Nov. 19, 2019

(54) DISPLAY APPARATUS AND METHOD FOR CONTROLLING THE SAME

(71) Applicant: SAMSUNG ELECTRONICS CO., LTD., Suwon-si (KR)

(72) Inventors: Jae Hoo Park, Suwon-si (KR); Gyu Sung Do, Seoul (KR); Il Ki Min, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 310 days.

(21) Appl. No.: 15/508,207

(22) PCT Filed: Aug. 5, 2015

(86) PCT No.: PCT/KR2015/008169
§ 371 (c)(1),
(2) Date: Mar. 2, 2017

(87) PCT Pub. No.: WO2016/036014
PCT Pub. Date: Mar. 10, 2016

(65) Prior Publication Data
US 2017/0289491 A1    Oct. 5, 2017

(30) Foreign Application Priority Data
Sep. 2, 2014  (KR) .................. 10-2014-0116172

(51) Int. Cl.
*H04N 5/64*   (2006.01)
*G09F 9/30*   (2006.01)
(Continued)

(52) U.S. Cl.
CPC ............... *H04N 5/64* (2013.01); *F16M 11/22* (2013.01); *G09F 9/301* (2013.01); *G09G 3/3216* (2013.01);
(Continued)

(58) Field of Classification Search
CPC ............................... G09F 9/301; G03B 21/58
See application file for complete search history.

(56) References Cited

U.S. PATENT DOCUMENTS 9,081,540 B1 *   7/2015   Cho ...................... G06F 1/1601
2013/0114193 A1   5/2013   Joo et al.
(Continued)

FOREIGN PATENT DOCUMENTS

| JP | 2007-171658 A | 7/2007 |
| KR | 10-1993-0022871 A | 11/1993 |
| KR | 10-2014-0095840 A | 8/2014 |

OTHER PUBLICATIONS

International Search Report (PCT/ISA/210) dated Jan. 26, 2016 issued by the International Searching Authority in counterpart International Application No. PCT/KR2015/008169.
(Continued)

*Primary Examiner* — Christopher E Mahoney
(74) *Attorney, Agent, or Firm* — Sughrue Mion, PLLC (57) ABSTRACT

Disclosed is a display apparatus including a display module and a driving apparatus configured to deform the display module. The display module is deformed by the driving apparatus so as to be in a flat surface state, a first curved surface state in which both sides of the display module protrude forward, and a second curved surface state in which the both sides of the display module retreat backward.

19 Claims, 12 Drawing Sheets

(51) Int. Cl.
  *G09G 3/3216* (2016.01)
  *H01L 27/32* (2006.01)
  *H01L 51/52* (2006.01)
  *H04N 5/655* (2006.01)
  *H04N 9/30* (2006.01)
  *F16M 11/22* (2006.01)

(52) U.S. Cl.
  CPC .......... *H01L 27/3213* (2013.01); *H01L 51/52* (2013.01); *H04N 5/655* (2013.01); *H04N 9/30* (2013.01); *H01L 2251/5338* (2013.01)

(56) References Cited

U.S. PATENT DOCUMENTS

| | | | | |
|---|---|---|---|---|
| 2014/0098075 A1* | 4/2014 | Kwak | ................... | G06F 3/0487 345/204 |
| 2014/0112704 A1* | 4/2014 | Vanska | ..................... | G06F 1/16 403/112 |
| 2014/0118910 A1* | 5/2014 | Sung | ....................... | G09F 9/301 361/679.01 |
| 2014/0140023 A1 | 5/2014 | Lee et al. | | |
| 2014/0168202 A1* | 6/2014 | Bae | ....................... | G06F 1/1652 345/214 |
| 2014/0198465 A1* | 7/2014 | Park | ..................... | H05K 5/0226 361/749 |
| 2014/0354519 A1* | 12/2014 | Lee | .......................... | G09F 9/301 345/76 |
| 2015/0009635 A1* | 1/2015 | Kang | ..................... | G09F 9/301 361/749 |
| 2015/0092361 A1* | 4/2015 | Cho | ........................ | H02K 7/00 361/749 |
| 2015/0145837 A1* | 5/2015 | Park | ......................... | H04N 5/64 345/184 |
| 2015/0192952 A1* | 7/2015 | Jung | ..................... | G06F 1/1601 361/747 |
| 2017/0052566 A1* | 2/2017 | Ka | ........................ | G06F 3/0483 |
| 2017/0162171 A1* | 6/2017 | Cho | ......................... | G09G 5/02 |

OTHER PUBLICATIONS

Written Opinion (PCT/ISA/237) dated Jan. 26, 2016 issued by the International Searching Authority in counterpart International Application No. PCT/KR2015/008169.

* cited by examiner

DISPLAY APPARATUS AND METHOD FOR CONTROLLING THE SAME

CROSS-REFERENCE TO RELATED APPLICATION

This is a National Stage Entry of International Application No. PCT/KR2015/008169 filed on Aug. 5, 2015, claiming priority based on Korean Patent Application No. 10-2014-0116172 filed on Sep. 2, 2014, the contents of all of which are incorporated herein by reference in their entirety.

TECHNICAL FIELD

Disclosed is a display apparatus provided with a deformable display module and a driving apparatus configured to deform the display module, and a method for controlling the same.

BACKGROUND ART

In general, a display apparatus includes a display module on which an image is display, and types of the display apparatus include a television and a monitor.

One type of the display apparatus may be provided with a display module that can be deformed to be in a flat surface state or a curved surface state in which both sides of the display module protrude forward, so that the display module is used in a flat surface state or a curved surface state.

DISCLOSURE OF INVENTION

Technical Problem

The present invention provides a display apparatus allowing both sides of a display module or a display unit to be moved not only forward but also backward.

The present invention provides a display apparatus capable of preventing a rear side of the display unit from being exposed to the outside.

Solution to Problem

According to an aspect of the present invention, there is provided a display apparatus including: a display module; a driving apparatus configured to deform the display module; and one pair of deformation guides configured to deform the display module to be in a flat surface state, a first curved surface state in which both sides of the display module protrude forward, and a second curved surface state in which the both sides of the display module retreat backward by receiving power form the driving apparatus.

The display apparatus may further include a base member disposed at a rear of the display module to support a central portion of the display module.

The display apparatus may further include a stand connected to a lower side of the base member such that the display apparatus is used in an upright state on a horizontal plane.

The driving apparatus may include: a driving motor configured to generate power, a pinion rotated by the driving motor; and one pair of racks engaged with the pinion so as to move in left side and right side directions according to rotation of the pinion, each rack moving in a direction opposite to a direction of the remaining.

The one pair of deformation guides may include a plurality of links that extend in left side and right side directions and rotatably coupled to each other, wherein the plurality of links may include a base link receiving power from the driving apparatus, an end link rotatably installed at the display module, and at least one connection link connecting the base link to the end link.

The display module may include a plurality of hinge brackets which are installed at a rear surface of the display module and to which the plurality of links are rotatably coupled.

The end link may be rotatably coupled to the hinge bracket, and the base link and the at least one connection link may be rotatably coupled to the hinge bracket through a plurality of rotating hinges.

The rotating hinge may include a first hinge part rotatably coupled to the hinge bracket and a second hinge part rotatably coupled to a coupling part between the base link and the connection link.

The rotating hinge may include one pair of guide surfaces that are inclined with respect to the links coupled to the rotating hinge, respectively.

The display module may include a display panel on which a screen is display and a support panel supporting a rear surface of the display panel.

The display panel may be provided using an organic light emitting diode panel.

According to another aspect of the present invention, there is provided a display apparatus including a display unit, wherein the display unit is configured to deformable to be in a flat surface state, a first curved surface state in which both sides of the display unit protrude forward, and a second curved surface state in which the both sides of the display unit retreat backward.

The display apparatus may further include one pair of speaker modules installed at both sides of the display unit.

The one pair of speaker modules are rotatably installed at the both sides of the display unit.

According to another aspect of the present invention, there is provided a method for controlling a display apparatus provided with a display unit, wherein the display unit is configured to be deformable to be in a flat surface state, a first curved surface state in which both sides of the display unit protrude forward, and a second curved surface state in which the both sides of the display unit retreat backward, and the display unit is deformed to be in the second curved surface when power is shut off.

When power is applied, the display unit may be deformed from the second curved surface state to a preset state between the flat surface state and the first curved state.

Advantageous Effects of Invention

According to the above-described aspects of the present invention, the display apparatus has the display module and the display unit thereof deformed to be in a flat surface state, a first curved state in which both sides of each of the display module and the display unit protrude forward, and a second curved surface state in which both sides of each of the display module and the display unit protrude backward.

In addition, the display apparatus has the display unit deformed to be in the second curved surface state when power is shut off, so that a rear side of the display unit is blocked by both sides of the display unit and is prevented from being exposed to the outside.

MODE FOR THE INVENTION

The invention is described more fully hereinafter with reference to the accompanying drawings, in which embodiments of the invention are shown.

Hereinafter, a display apparatus according to the first embodiment of the present invention will be described.

Figure 1:
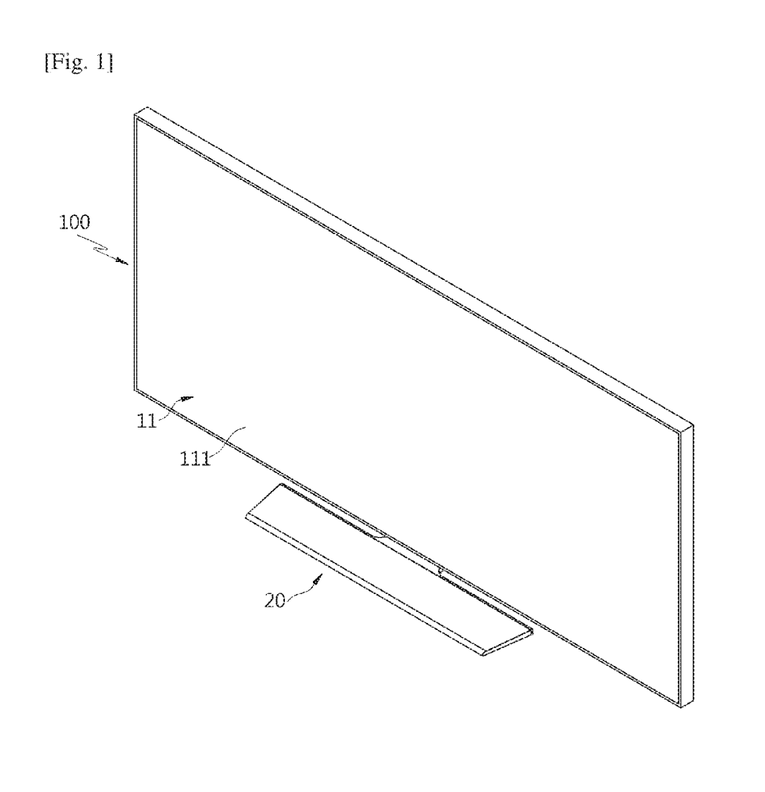
FIG. 1 is a perspective view schematically illustrating a display unit of a display apparatus according to the first embodiment of the present invention, the display unit being in a flat surface state.

The display apparatus according to the first embodiment of the present disclosure includes a display unit 10 on which a screen is displayed, and a stand 20 allowing the display unit 10 to be used in an erect state on a horizontal plane, as shown in FIG. 1.

Figure 4:
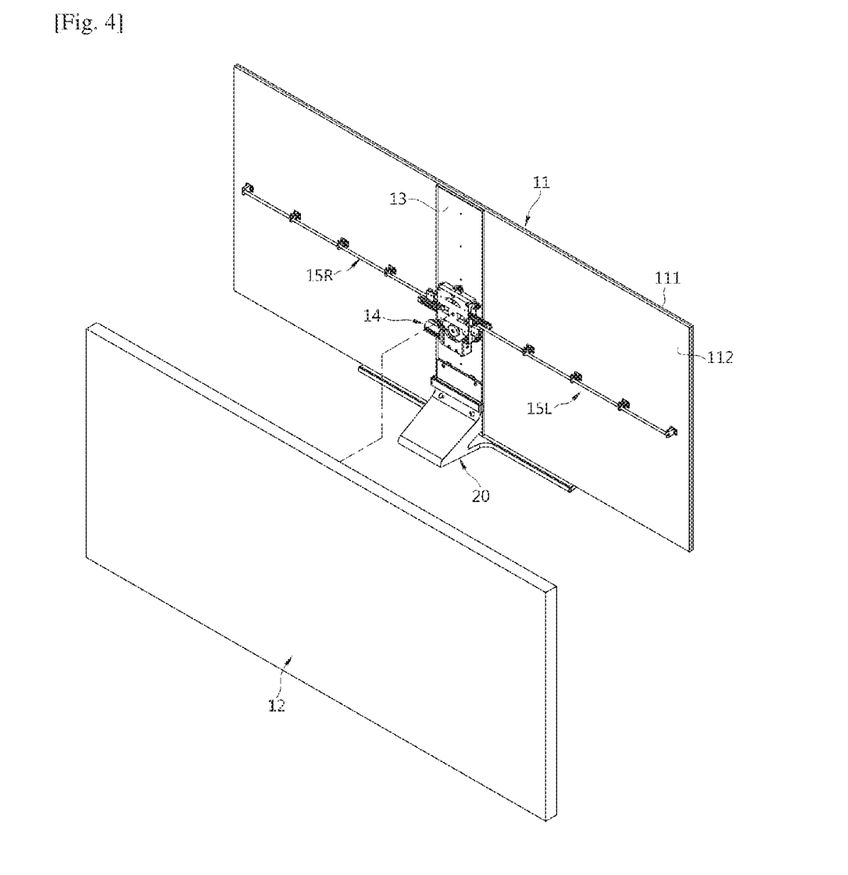
FIG. 4 is an exploded perspective view illustrating a display apparatus according to the first embodiment of the present invention.

The display unit 10 includes a display module 11 on which a screen is displayed and a case 12 covering a rear surface of the display module 11 while accommodating the display module 110, as shown in FIG. 4.

Although not shown in the drawings, a power supply substrate (not shown) to supply the display apparatus with power, a signal processing substrate (not shown) to process various image and sound signals, a panel driving substrate (not shown) to control a display panel 111, which will be described later, and a timing control substrate (not shown) to transmit image signals to the display panel 111 are disposed between the display module 11 and the case 12. Alternatively, theses substrates may be installed on a rear surface of the display module 11 or on an inner surface of the case 12.

The display module 11 includes the display panel 111 formed of an organic light emitting diode panel and a support panel 112 provided in the form of a quadrangle corresponding to the display panel 111 while supporting a rear surface of the display panel 111.

Figure 2:
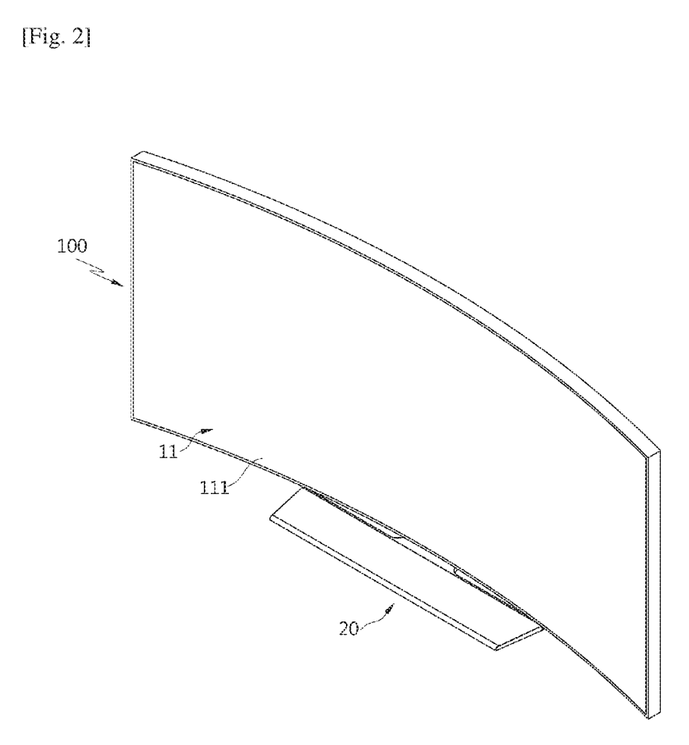
FIG. 2 is a perspective view illustrating a display unit of a display apparatus according to the first embodiment of the present invention, the display unit being in a first curved surface state in which both sides of the display unit protrude forward.
Figure 3:
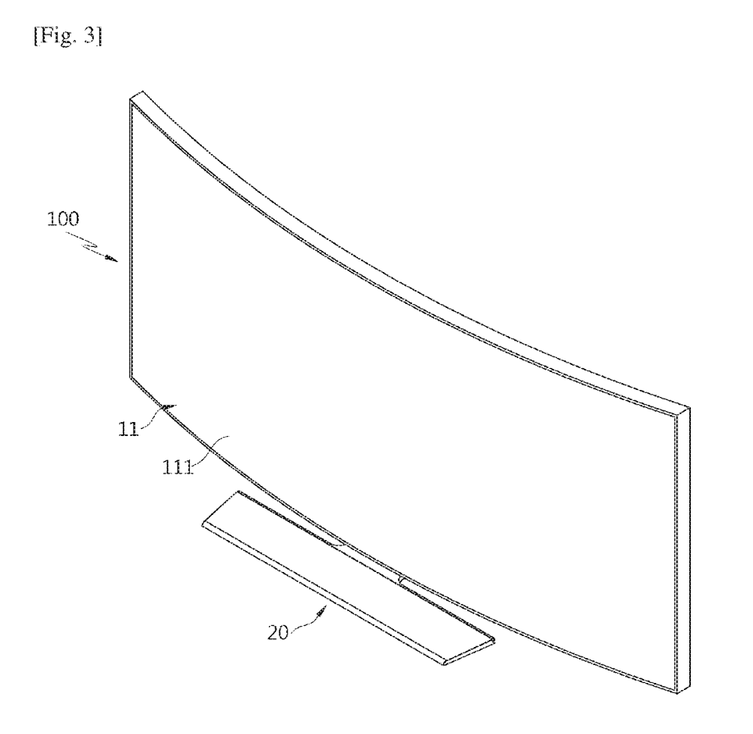
FIG. 3 is a perspective view illustrating a display unit of a display apparatus according to the first embodiment of the present invention, the display unit being in a second curved surface state in which both sides of the display unit retreats backward.

The display unit 10 of the display apparatus having been in a flat surface state 2 may be deformed to be in a first curved surface state in which both sides of the display unit 10 protrude forward as shown in FIG. 2, and may be deformed to be in a second curved surface state in which the both sides of the display unit 10 retreat backward as shown in FIG. 3. When the display unit 10 is deformed to be in the flat surface state, a normal view is possible. When the display unit 10 is bent to be in the first curved surface state, a user may have impression that a partial 3D image is represented from a 2D image. In addition, when the display unit 10 is bent to be in the second curved surface state, the display unit 10 may be viewed by a larger number of users.

As for a viewing angle of the display unit 10 at which an image is viewed, the display unit 10 in the first curved state has the minimum viewing angle, the intermediate viewing angle in the flat surface state, and the maximum viewing angle in the second curved state. In addition, the number of people viewing the display unit 10 at the same time may be changed in proportional to the viewing angle according to each state of the display unit 10.

As described above, the display panel 111 forming the display module 11 may be composed of an organic light emitting diode panel in the form of a film that may be easily deformable, and the support panel 12 is composed of a deformable metal plate. Accordingly, the display module 11 may be deformed to in one of the flat surface state, the first curved surface state and the second curved surface state.

The case 12 is deformable to correspond to the shape of the display module 11, and is configured to cover a base member 13, a driving apparatus 14 and deformation guides 15R and 15L which will be described later.

In order to deform the display module 11 and the display unit 10, the display unit 10 includes the base member 13 supporting the central portion of the display module 11, the driving apparatus 14 installed on the base member 13 and generating power and one pair of deformation guides 15R and 15L deforming the display module 11 by receiving power from the driving apparatus 14.

The base member 13 is provided in the form of a panel elongated in upper side and lower side directions and installed at the central portion of a rear surface of the display module 11. Accordingly, the base member 13 prevents the central portion of the display module 11 from moving front and rear side directions when both sides of the display module 11 are deformed. The driving apparatus 14 is installed on the rear surface of the base member 13. A stand 20 is fixed at a lower side of the base member 13, so that the display module 11 is supported by the stand 20 through the base member 13.

Figure 6:
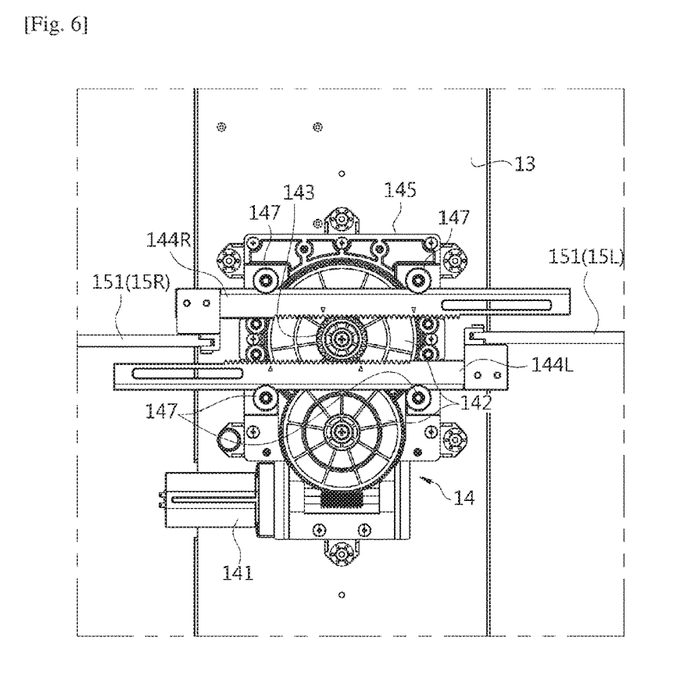
FIG. 6 is a rear side view illustrating the configuration of a driving apparatus of a display apparatus according to the first embodiment of the present invention.

The driving apparatus 14 includes a driving motor 141 generating rotary force, a plurality of gears 142 serving as reduction gears, a pinion 143 rotated by receiving a rotary force through the gears 142 and one pair of racks 144R and 144L moving in left and right side directions according to rotation of the pinion 143 while engaged with the pinion 143, as shown in FIG. 6. The one pair of racks 144R and 144L are engaged to an upper side and a lower side of the pinion 143, respectively, and move in a contrary manner according to rotation of the pinion 143, that is, in symmetrical to each other.

Figure 5:
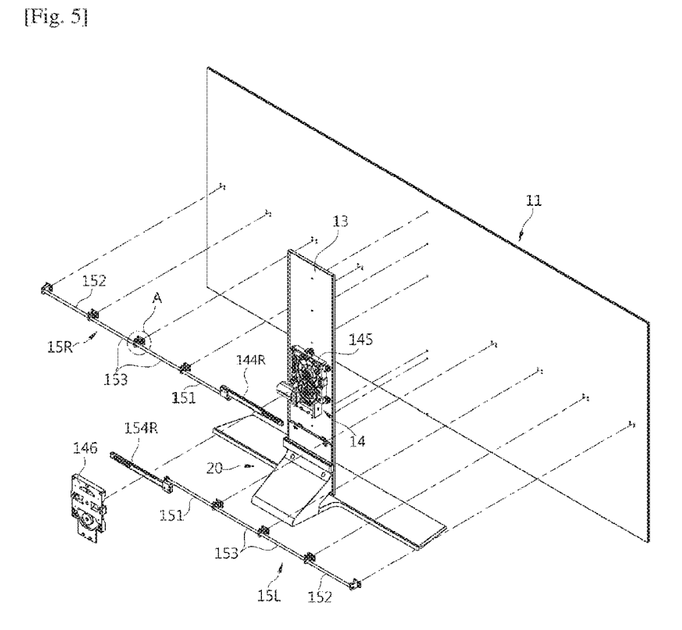
FIG. 5 is an exploded perspective view illustrating an installation state of a driving apparatus and a deformation guide of a display apparatus according to the first embodiment of the present invention.

In addition, the driving apparatus 14 includes a driving housing 145 accommodating the gears 142 and the pinion 143 and a driving cover 146 covering a rear surface of the driving housing 145 that is open, as shown in FIG. 5. The one pair of racks 144R and 144L are movably installed at the driving housing 145 through pulleys 147 as shown in FIG. 6.

The one pair of deformation guides 15R and 15L are connected to the two racks 144R and 144L, respectively, and move together with the racks 144R and 144L while in symmetric to each other, thereby allowing both sides of the display module 11 to be simultaneously deformed.

Figure 8:
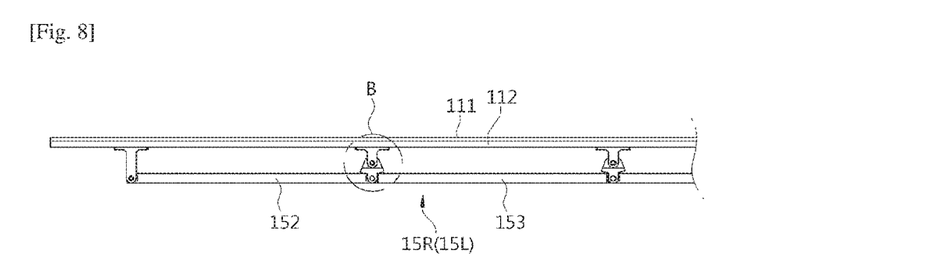
FIG. 8 is a schematic view illustrating a display module of a display apparatus according to the first embodiment of the present invention, the display module being in a flat surface state.
Figure 9:
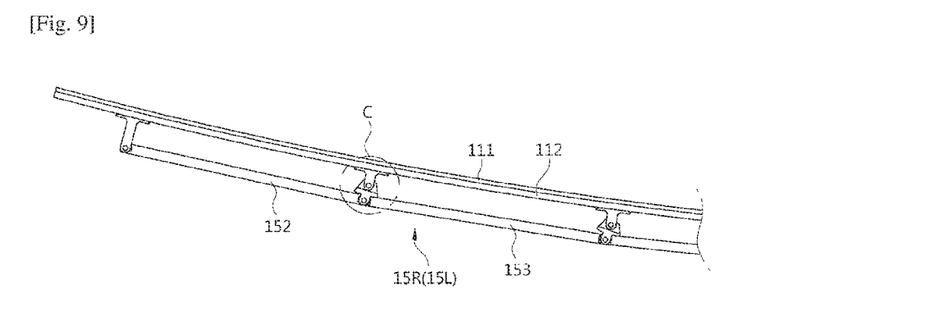
FIG. 9 is a schematic view illustrating a display module of a display apparatus according to the first embodiment of the present invention, the display module deformed to be in a first curved surface state by a bending guide.

Accordingly, when the two racks 144R and 144L move to the both sides of the display module 11 by power generated by the driving apparatus 14 in the flat surface state of the display module 11 (or the display unit 10) as shown in FIG. 8, the deformation guides 15R and 15L are also moved to the both sides of the display module 11 together with the two racks 144R and 144, and accordingly, the both sides of the display module 11 are moved forward, allowing the display module 11 to be deformed in the first curved surface state as shown in FIG. 9. When the two racks 144R and 144L move to the central portion of the display module 11 by power generated by the driving apparatus 14 in the flat surface state of the display module 11 as shown in FIG. 8, the deformation guides 15R and 15L are also moved to the central portion of the display module 11 together with the two racks 144R and 144, and accordingly, the both sides of the display module 11 are moved backward, allowing the display module 11 to be deformed in the second curved surface state as shown in FIG. 10.

The deformation guides 15R and 15L include a plurality of links 151, 152 and 153 that are rotatably coupled to each other as shown in FIG. 5. The plurality of links 151, 152 and 153 include a base link 151 connected to the rack 144R and 144, an end link 152 rotatably installed at one of the both sides of the display module 11, and a plurality of connection links 153 connecting the base link 151 to the end link 152. Hinge brackets 113 to which the links 151, 152 and 153 forming the deformation guides 15R and 15L are rotatbly coupled are installed on the rear surface of the display module 11.

Figure 7:
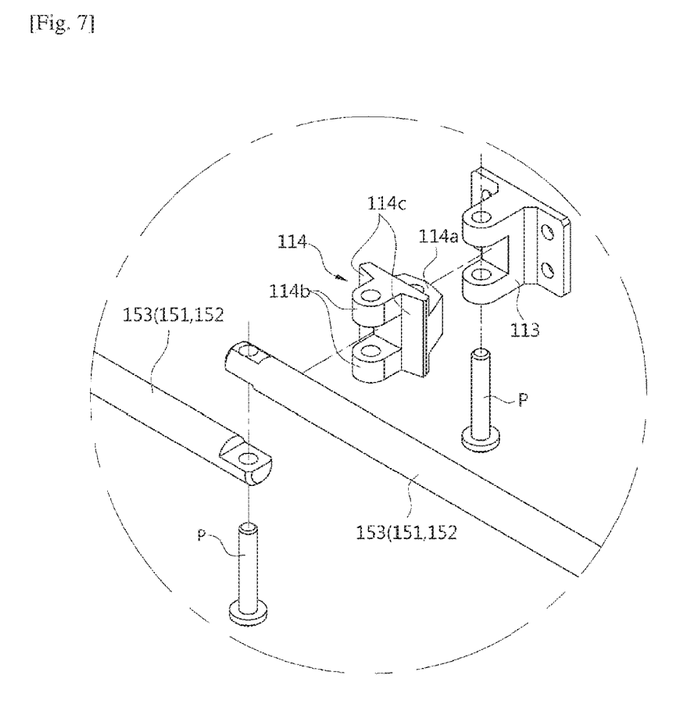
FIG. 7 is an enlarged view showing portion A of FIG. 5.

Front ends of the end links 152 positioned at the both sides of the display module 11 are directly coupled to the hinge brackets 113, and each of coupling parts of the links 151, 153 and 153 rotatably coupled to each other is rotatably coupled to the hinge bracket 113 through a rotating hinge 114 as shown in FIG. 7. The rotating hinge 114 includes a first hinge part 114a rotatably coupled to the hinge bracket 113 and a second hinge part 114b rotatably coupled to the connection link 153. The first hinge part 114a is rotatably coupled to the hinge bracket 113 through a pin P, and the second hinge part 114b is rotatbly coupled to the links 151, 152 and 153 through a pin P.

Figure 10:
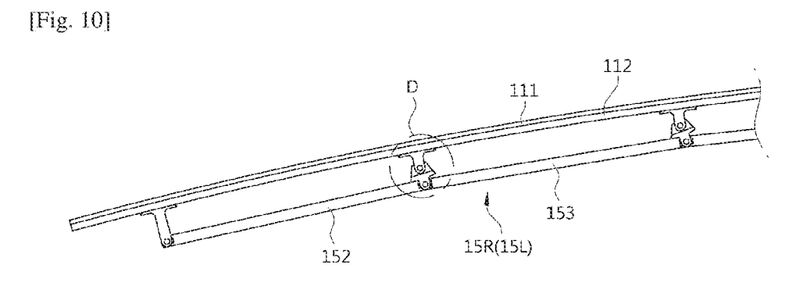
FIG. 10 is a schematic view illustrating a display module of a display apparatus according to the first embodiment of the present invention, the display module deformed to be in a second curved surface state by a bending guide.

As the links 151, 152 and 153 are installed at the rear surface of the display module 11 in the above manner, the display module 11 being in the flat surface state as shown in FIG. 8 allows a distance between the rear surface of the display module 11 and the links 151, 152 and 153 to be maintained at a predetermined distance or below such that the display module 11 is deformed to be in the first curved surface or the second curved surface state as shown in FIGS. 9 and 10. Accordingly, the display unit 10 may be provided to have a predetermined thickness or below.

Figure 11:
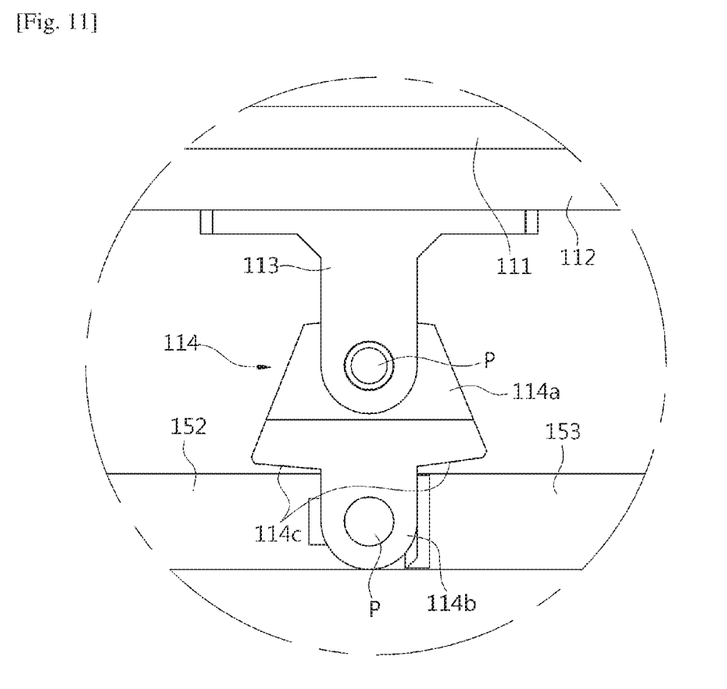
FIG. 11 is an enlarged view showing portion B of FIG. 8.
Figure 12:
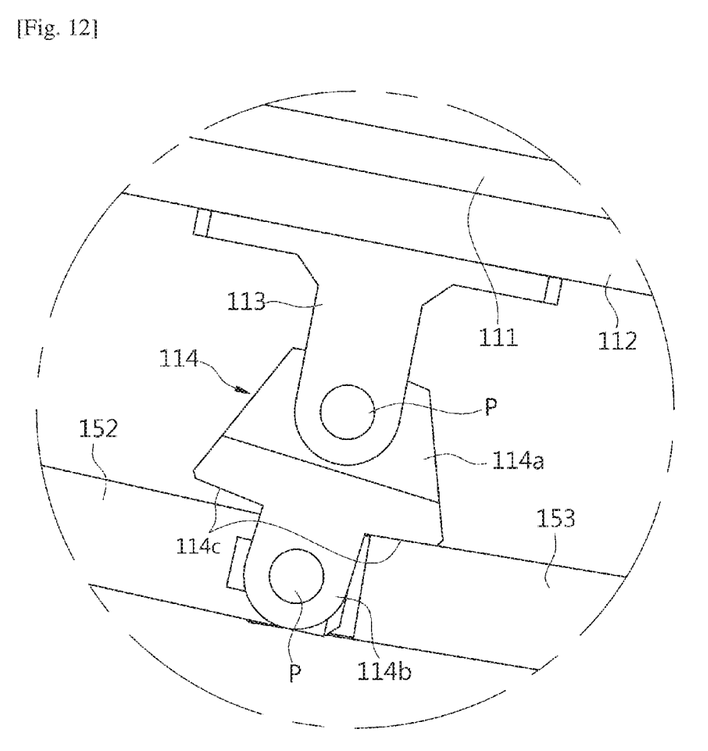
FIG. 12 is an enlarged view showing portion C of FIG. 9.

In addition, each rotating hinge 114 includes one pair of guide surfaces that are inclined with respect to any two of the links 151, 152 and 153 coupled to the rotating hinge 114 as shown in FIG. 7. In the flat surface state of the display module 11, the two guide surfaces 114c are spaced apart from two of the links 151, 152 and 153 as shown in FIG. 11, and when the display module 11 is deformed to be in the first curved surface or the second curved surface according to movement of the deformation guides 15R and 15L, one of the two guide surfaces 114 allows a corresponding one of the link 151, 152 and 153 to be pivoted by pressing the corresponding link, so that adjacent two links 151, 152 and 153 are pivoted relative to each other by a greater angle. Through such a construction, the links 151, 152 and 153 are pivoted relative to each other by a greater angle, so that the display module 11 is deformed at a greater curvature.

Figure 13:
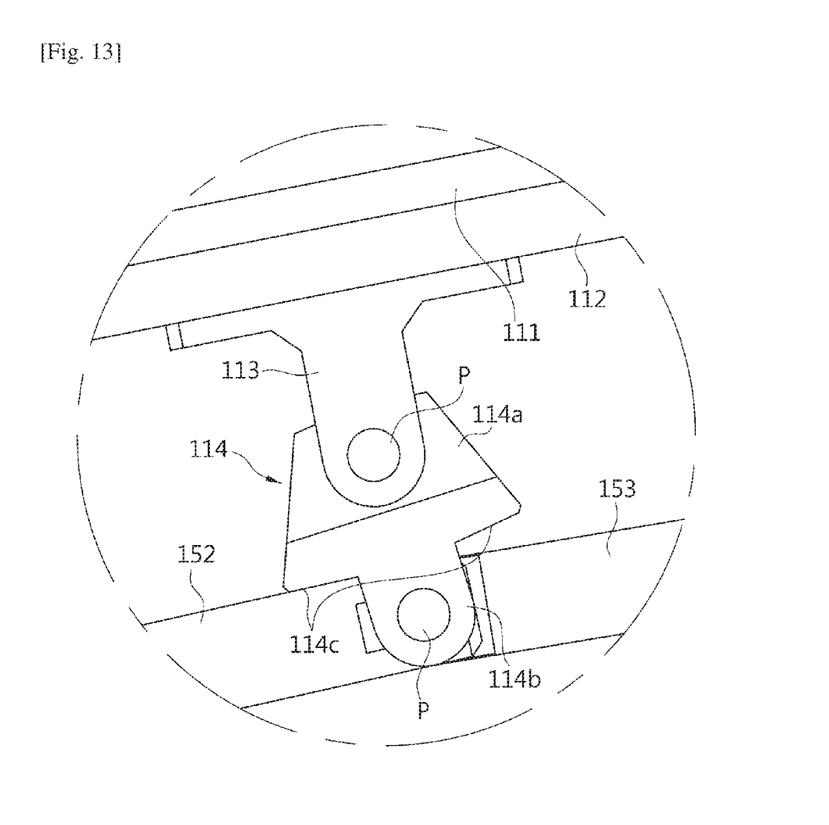
FIG. 13 is an enlarged view showing portion D of FIG. 10.
Figure 14:
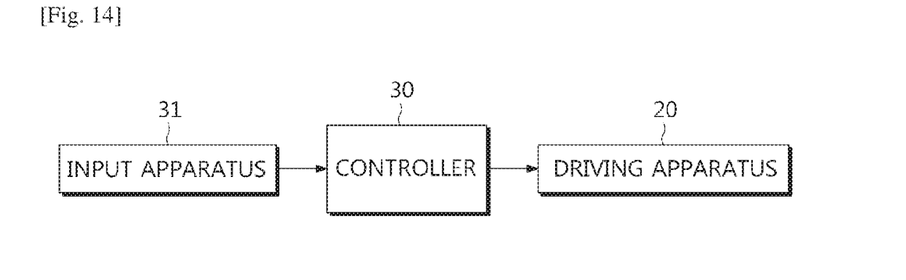
FIG. 14 is a control block diagram of a display apparatus according to the first embodiment of the present invention.

In addition, as shown in FIG. 13, the display apparatus includes a controller 30 configured to control the display apparatus and an input apparatus 31 allowing a user to select an operation of the display apparatus. The input apparatus includes a button (not shown) provided on the display apparatus or on a remote controller that operates the display apparatus.

Accordingly, the controller 30 controls the driving apparatus 14 according to a command of a user entered through the input apparatus 31, so that the display unit 10 is deformed to be in one of the flat surface state, the first curved surface state and the second curved surface state.

The controller 30 according to the present disclosure controls the driving apparatus to deform the display unit 10 to be in the second curved surface state, at the time of power-shutoff of the display apparatus. The display apparatus has a rear surface thereof installed adjacent to a wall of indoors, and when the display unit 10 is deformed to be in the second curved surface state due to power-shutoff, both side ends of the display unit 10 move toward the wall, so that the display unit 10 occupies a smaller space.

In addition, when the display apparatus does not operate due to power-shutoff, a rear surface of the display unit 10, which has a poor appearance when compared to a front surface of the display unit, is blocked by the both sides of the display unit 10, making the rear surface invisible to the outside. As a type of a display apparatus, a wall mount type display apparatus has a display unit 10 configured to be installed to a wall using a wall mount (not shown). When the wall mount type display apparatus is deformed to be in the second surface state, the wall mount is blocked by both sides of the display unit 10, and thus invisible to the outside, thereby improving the aesthetic quality of the display apparatus in non-operation.

In addition, when power is applied to the display apparatus having been in the second curved surface state due to the power shut off, the controller 30 controls the driving apparatus 14 such that the display unit 10 is deformed to be in a preset state between the flat surface state and the second curved surface state from the second curved surface state.

Figure 15:
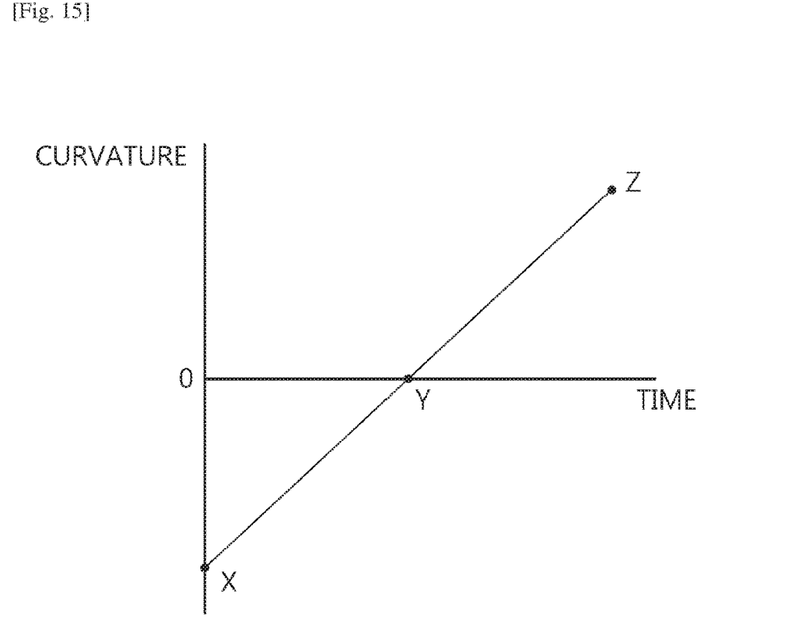
FIG. 15 is a graph showing change of a curvature of a display unit of a display apparatus according to the first embodiment of the present invention, the curvature being changed over time.

The display unit 10 according to an embodiment of the present invention may be provided to be continuously deformed over time from the point of time of power application as shown in FIG. 15, that is, from the second curved surface state having a negative curvature (−) to the flat surface state having a zero curvature (0) and then to the first curved surface state having a positive curvature (+).

Figure 16:
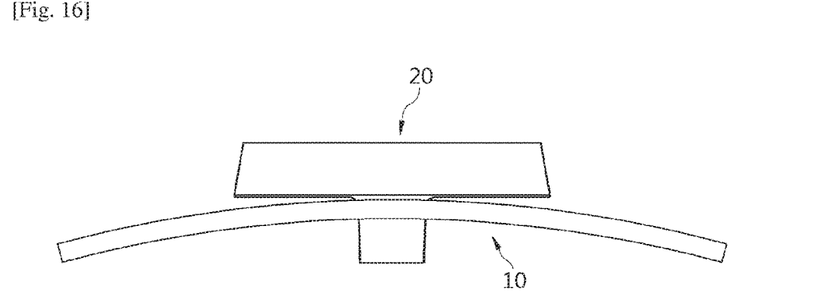
FIGS. 16 to 18 are plan views illustrating an operation of a display apparatus according to the second embodiment of the present invention.
Figure 17:
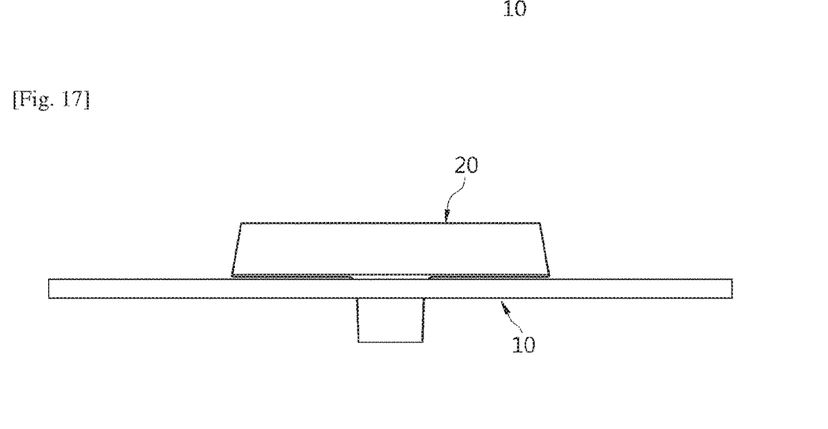
Figure 18:
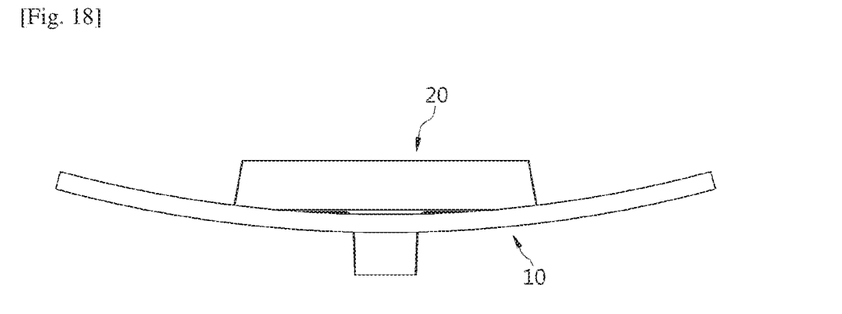

FIG. 16 is a plan view illustrating a display apparatus, corresponding to position X of FIG. 15, in which the display unit 10 is deformed to be in the second curved surface state having a negative curvature with both sides thereof moved backward. FIG. 17 is a plan view illustrating a display apparatus, corresponding to position Y of FIG. 15, in which the display unit 10 is deformed to be in the flat surface state having a curvature of 0. FIG. 18 is a plan view illustrating a display apparatus, corresponding to position Z of FIG. 15, in which the display unit 10 is deformed to be in the first curved surface state having a positive curvature with both sides thereof moved forward.

The display apparatus according to the present disclosure has the controller 30 that is configured to allow the display unit 10 to be automatically deformed to be in a flat surface state or a curved surface state by the driving apparatus 20 depending on the types of contents being displayed on the display unit 10.

For example, upon receiving an input indicating that a content displayed on the display unit 10 is a news content, the controller 30, allows the display unit 10 to be deformed to be in the flat surface state through the driving apparatus 20, and upon receiving an input indicating that a content displayed on the display unit 10 is a movie content, allows the display unit 10 to be deformed to be in the first curved surface state through the driving apparatus 20.

Such information about the type of contents may be directly input by a user through the input apparatus 31, or may be input together with an image signal through an image transmitter of a broadcasting station.

Although the display unit 10 according to the present embodiment is illustrated as being deformed to be in one of the flat surface state, the first curved surface state and the second curved surface state, the present disclosure is not limited thereto. For example, depending on a selection of a user, the display unit 10 may be deformed in a continuous manner or in a stepwise manner within a predetermined range of curvatures. That is, when a user presses a button, the display unit 10 may be allowed to be deformed in a continuous manner or in a stepwise manner in proportional to the time for which the button is being pressed or in proportion to the number of pressing operations of the button.

Although the display module 11 of the display apparatus according to the present embodiment is illustrated as being deformed by the driving apparatus 14, the present disclosure is not limited thereto. For example, the display module may be manually deformed by a force directly applied by a user to the display module, omitting the driving apparatus 14. In this case, the pinion and the rack may be used in the same manner as those described above such that both sides of the display module are deformed in the same degree.

Hereinafter, the display apparatus according to the second embodiment of the present disclosure will be described with reference to the drawings.

Figure 19:
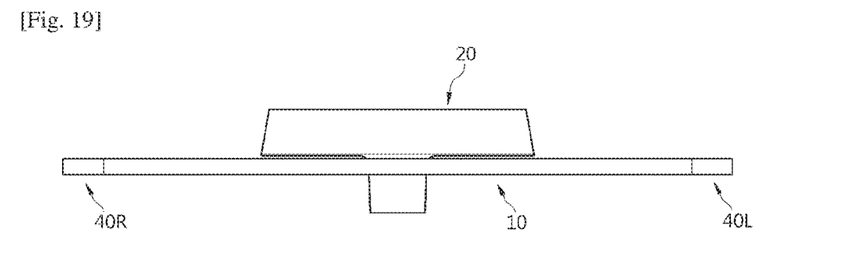
FIGS. 19 to 21 are plan views illustrating an operation of a display apparatus according to the second embodiment of the present invention.
Figure 20:
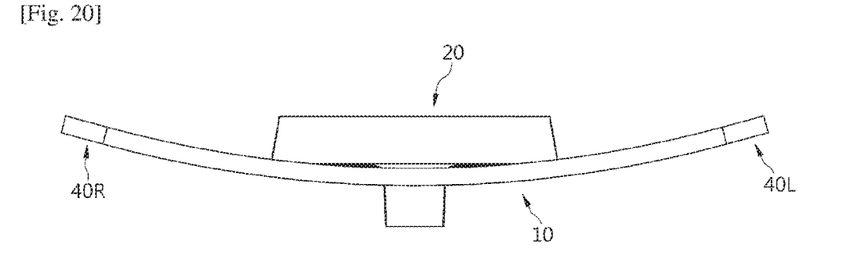
Figure 21:
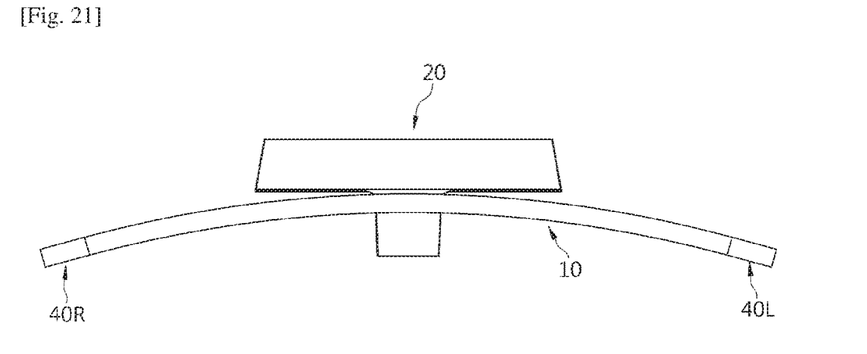

Referring to FIGS. 19 to 21, the display apparatus according to the present embodiment includes a display unit 10 and one pair of speaker modules 40R and 40L that are disposed at both sides of the display unit 10 to generate sound.

The display unit 10 according to the present embodiment may be deformed to be in one of the flat surface state, the first curved surface state and the second curved surface state, similar to the display unit described in the previous embodiment of the present disclosure. The speaker modules 40R and 40L are fixed installed at both sides of the display unit 10, respectively, having arrangement angles thereof varied with the deformation.

That is, the speaker modules 40R and 40L are disposed to face the front when the display unit 10 is provided in a flat surface state, and are inclinedly disposed to be headed to a center front portion of the display unit 10 as the display unit 10 is deformed to be in the first curved surface state, so that sound generated from the speaker modules 40R and 40L are concentrated onto a user who exists at the front of the display unit 10. In addition, as the display unit 10 is deformed to be in the second curved surface state, the speaker modules 40R and 40L are inclinedly disposed to be headed to lateral sides, so that sound is widely spread.

Figure 22:
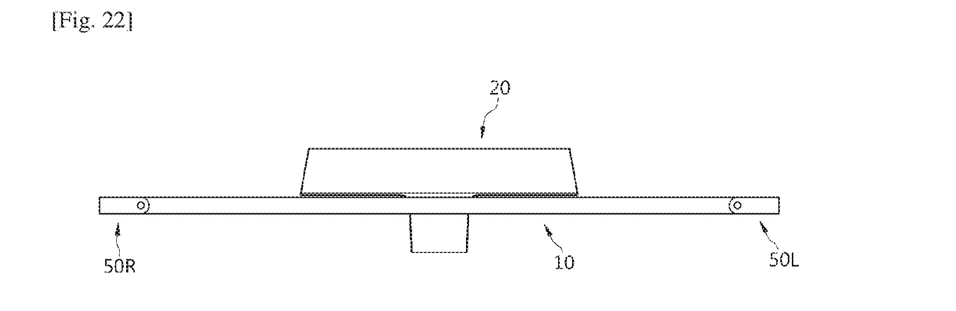
FIGS. 22 to 23 are plan views illustrating an operation of a display apparatus according to the third embodiment of the present invention.
Figure 23:
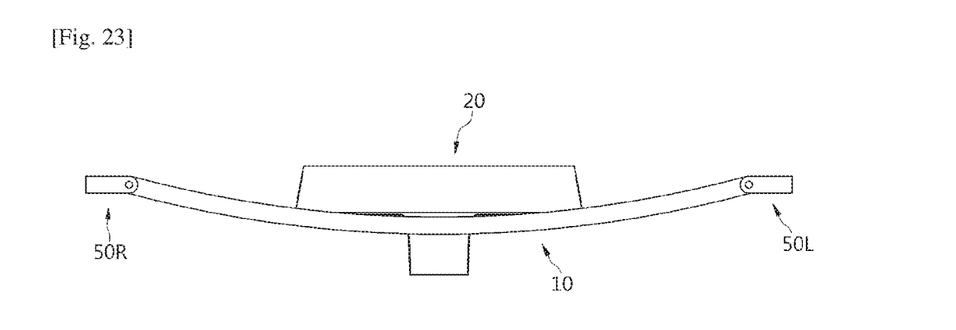

Although the speaker modules 40R and 40L according to the second embodiment of the present disclosure are fixedly installed at the display unit 10 such that the arrangement angles of the speaker modules 40R and 40L are changed according to deformation of the display unit 10, the present disclosure is not limited. Referring to FIGS. 22 and 23, speaker modules 50R and 50L according to the third embodiment of the present disclosure are rotatably installed at both sides of the display unit 10, so that rotations of the speaker modules 50R and 50L are independently adjusted according to deformation of the display unit 10.

In this case, the rotations of the speaker modules 50R and 50L may be automatically achieved by power generated from a motor or an actuator at predetermined angles, or may be manually achieved according to a user command that is input through the input apparatus 31. In addition, the rotations of the speaker modules 50R and 50L may be achieved by a force directly applied by a user.

Although the display apparatus according to the present embodiment includes a stand 20 allowing the display unit 10 to be used in an erect state on a horizontal plane, the present disclosure is not limited thereto. For example, the display apparatus includes a wall type mount that is fixed to a wall, so that the display apparatus is used while installed at the wall through the wall type mount.

Although the display module 11 according to the embodiment of the present disclosure includes a display panel 111 including an organic light emitting diode, which is easily deformed, the present disclosure is not limited thereto. For example, the display module 11 may include a display panel, including a liquid crystal display panel, and a backlight supplying light to the display panel.

Although a few embodiments of the present disclosure have been shown and described, it would be appreciated by those skilled in the art that changes may be made in these embodiments without departing from the principles and spirit of the invention, the scope of which is defined in the claims and their equivalents.

The invention claimed is:

1. A display apparatus comprising:
   a display module;
   a driving apparatus configured to deform the display module; and
   a pair of deformation guides configured to deform the display module to be in a flat surface state, a first curved surface state in which both sides of the display module protrude forward, and a second curved surface state in which both sides of the display module retreat backward by receiving power from the driving apparatus, wherein the pair of deformation guides include a plurality of links that extend in left side and right side directions and that are rotatably coupled to each other.

2. The display apparatus of claim 1, further comprising a base member disposed at a rear of the display module to support a central portion of the display module.

3. The display apparatus of claim 2, further comprising a stand connected to a lower side of the base member such that the display apparatus is used in an upright state on a horizontal plane.

4. The display apparatus of claim 2, wherein the driving apparatus comprises:
a driving motor configured to generate power;
a pinion rotated by the driving motor; and
a pair of racks engaged with the pinion so as to move in left side and right side directions according to rotation of the pinion, each rack moving in a direction opposite to a direction of the other rack.

5. The display apparatus of claim 1,
wherein the plurality of links include a base link receiving power from the driving apparatus, an end link rotatably installed at the display module, and at least one connection link connecting the base link to the end link.

6. The display apparatus of claim 5, wherein the display module includes a plurality of hinge brackets which are installed at a rear surface of the display module and to which the plurality of links are rotatably coupled.

7. The display apparatus of claim 6, wherein the end link is rotatably coupled to the hinge bracket, and the base link and the at least one connection link are rotatably coupled to the hinge bracket through a plurality of rotating hinges.

8. The display apparatus of claim 7, wherein the rotating hinge includes a first hinge part rotatably coupled to the hinge bracket and a second hinge part rotatably coupled to a coupling part between the base link and the connection link.

9. The display apparatus of claim 8, wherein the rotating hinge includes a pair of guide surfaces that are inclined with respect to the links coupled to the rotating hinge, respectively.

10. The display apparatus of claim 1, wherein the display module includes a display panel on which a screen is displayed and a support panel supporting a rear surface of the display panel.

11. The display apparatus of claim 10, wherein the display panel is provided using an organic light emitting diode panel.

12. The display apparatus of claim 1, further comprising a pair of speaker modules installed at both sides of the display module, respectively.

13. The display apparatus of claim 12, wherein the pair of speaker modules are rotatably installed at the both sides of the display module.

14. A display apparatus comprising a display unit, wherein the display unit is configured to deformable to be in a flat surface state, a first curved surface state in which both sides of the display unit protrude forward, and a second curved surface state in which the both sides of the display unit retreat backward, wherein the display unit includes:
a display module on which an image is displayed;
a pair of deformation guides configured to guide the display module to be deformed; and
a driving apparatus configured to generate power,
wherein the pair of deformation guides are configured to deform the display module by receiving power from the driving apparatus, and
wherein the pair of deformation guides include a plurality of links that extend in left side and right side directions and that are rotatably coupled to each other.

15. The display apparatus of claim 14,
wherein the plurality of links include a base link receiving power from the driving apparatus, an end link rotatably installed at the display module, and at least one connection link connecting the base link to the end link.

16. The display apparatus of claim 15, wherein:
the display module includes a plurality of hinge brackets which are installed at a rear surface of the display module and to which the plurality of links are rotatably coupled;
the end link is rotatably coupled to the hinge bracket; and
the base link and the at least one connection link are rotatably coupled to the hinge bracket through a plurality of rotating hinges.

17. The display apparatus of claim 14, further comprising a stand that allows the display unit to be used in an erect state on a horizontal plane,
wherein:
the display unit includes a base member configured to support a central portion of the display module; and
the stand is installed at a lower side of the base member.

18. The display apparatus of claim 14, further comprising a pair of speaker modules installed at both sides of the display unit, respectively.

19. The display apparatus of claim 18, wherein the pair of speaker modules are rotatably installed at the both sides of the display unit, respectively.

* * * * *